(12) United States Patent
Du et al.

(10) Patent No.: US 6,580,377 B1
(45) Date of Patent: Jun. 17, 2003

(54) HUFFMAN DECODING USING CASCADED SUB-TABLE LOOKUP METHOD

(75) Inventors: Robert Weixiu Du, Danville, CA (US); Chinping Q. Yang, Cupertino, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 43 days.

(21) Appl. No.: 09/870,176

(22) Filed: May 30, 2001

(51) Int. Cl.[7] .................................................. H03M 7/40
(52) U.S. Cl. ............................................. 341/67; 341/65
(58) Field of Search .................................... 341/65, 67

(56) References Cited

U.S. PATENT DOCUMENTS

| | | | | |
|---|---|---|---|---|
| 4,899,149 A | * | 2/1990 | Kahan | 341/67 |
| 5,138,316 A | * | 8/1992 | Konishi | 341/67 |
| 5,226,082 A | * | 7/1993 | Kustka | 380/46 |
| 5,600,812 A | | 2/1997 | Park | 395/410 |
| 5,675,332 A | | 10/1997 | Limberg | 341/67 |
| 6,246,347 B1 | * | 6/2001 | Bakhmutsky | 341/67 |

OTHER PUBLICATIONS

Kawahara et al., *High –Speed Software Implementation of Huffman Coding*, IEEE, Proceedings of the 1998 Data Compression Conference, Mar.–Apr. 1998, p. 553.*

* cited by examiner

*Primary Examiner*—Howard L. Williams
(74) *Attorney, Agent, or Firm*—Wood, Herron & Evans, L.L.P.

(57) ABSTRACT

A bitstream is sampled at an interval predetermined as a function of available processing power and memory storage capacity. The sampled bits are evaluated against a first layer Huffman decoding subtable. The subtable obtains the address of a second layer subtable from an indexed location identified by the sampled bits. A second bit sample is parsed to the designated second layer subtable, which outputs either an address for a third layer subtable, or a symbol and an associated code length.

22 Claims, 5 Drawing Sheets

| INDEXED LOCATION | INPUT SAMPLE | OUTPUT |
|---|---|---|
| 0 | 1101XXXXXXXX | "2" |
| 1 | 00000XXXXXXX | "E" |
| 2 | 00001XXXXXXX | "D" |
| 3 | 00010XXXXXXX | "F" |
| 4 | 00011XXXXXXX | "B" |
| 5 | 00100XXXXXXX | "L" |
| 6 | 00101XXXXXXX | "J" |
| 7 | 00110XXXXXXX | "7" |
| ... | ... | ... |
| 1704 | 0110101010XX | "4" |
| 1705 | 0110101010XX | "4" |
| 1706 | 0110101010XX | "4" |
| 1707 | 0110101010XX | "4" |
| ... | ... | ... |
| 4084 | 111111110011 | "@" |
| 4085 | 111111110100 | "#" |
| 4086 | 111111110101 | "%" |
| 4087 | 111111110110 | "=" |
| 4088 | 111111110111 | "+" |
| 4089 | 111111111000 | "↓" |
| 4090 | 111111111001 | "↑" |
| 4091 | 111111111010 | "←" |
| 4092 | 111111111011 | "→" |
| 4093 | 111111111100 | "$" |
| 4094 | 111111111101 | "~" |
| 4095 | 111111111110 | "}" |
| 4096 | 111111111111 | "{" |

FIG. 1

| INDEXED LOCATION | INPUT SAMPLE | OUTPUT |
|---|---|---|
| 601 | 0000 | SYMBOL "W", CODE LENGTH 7 |
| 602 | 1000 | SYMBOL "Q", CODE LENGTH 7 |
| 603 | 1001 | SYMBOL "R", CODE LENGTH 7 |
| 604 | 1010 | SYMBOL "[", CODE LENGTH 7 |
| 605 | 1011 | SYMBOL "]", CODE LENGTH 7 |
| 606 | 1100 | SYMBOL "Z", CODE LENGTH 7 |
| 607 | 1101 | SYMBOL "I", CODE LENGTH 8 |
| 608 | 1110 | SYMBOL ">", CODE LENGTH 7 |
| 609 | 1111 | SYMBOL "<", CODE LENGTH 7 |
| 610 | 01XX | SYMBOL "4", CODE LENGTH 7 |
| 611 | 0001 | SYMBOL "h", CODE LENGTH 7 |
| 612 | 0011 | SYMBOL "d1", CODE LENGTH 7 |
| 613 | 1001 | SYMBOL "R", CODE LENGTH 4 |
| 614 | 1010 | SYMBOL "[", CODE LENGTH 7 |
| 615 | 1000 | SYMBOL "Q", CODE LENGTH 7 |
| 616 | 01XX | SYMBOL "4", CODE LENGTH 7 |

| INDEXED LOCATION | INPUT SAMPLE | OUTPUT |
|---|---|---|
| 401 | 0000 | SUBTABLE 307 |
| 402 | 0001 | SUBTABLE 305 |
| 403 | 0010 | SUBTABLE 304 |
| 404 | 0011 | SUBTABLE 304 |
| 405 | 0100 | SUBTABLE 306 |
| 406 | 0101 | SUBTABLE 307 |
| 407 | 0110 | SUBTABLE 305 |
| 408 | 0111 | SUBTABLE 307 |
| 409 | 1000 | SUBTABLE 304 |
| 410 | 1001 | SUBTABLE 305 |
| 411 | 1010 | SUBTABLE 307 |
| 412 | 1011 | SUBTABLE 314 |
| 413 | 1100 | SUBTABLE 306 |
| 414 | 1101 | SYMBOL "2", CODE LENGTH 4 |
| 415 | 1110 | SUBTABLE 306 |
| 416 | 1111 | SUBTABLE 306 |

| INDEXED LOCATION | INPUT SAMPLE | OUTPUT |
|---|---|---|
| 501 | 0111 | SUBTABLE 311 |
| 502 | 1000 | SUBTABLE 319 |
| 503 | 1001 | SUBTABLE 313 |
| 504 | 1010 | SUBTABLE 312 |
| 505 | 1011 | SUBTABLE 322 |
| 506 | 1100 | SUBTABLE 311 |
| 507 | 1101 | SYMBOL "T", CODE LENGTH 8 |
| 508 | 1110 | SUBTABLE 311 |
| 509 | 1111 | SUBTABLE 313 |
| 510 | 0110 | SUBTABLE 321 |
| 511 | 010X | SYMBOL "1", CODE LENGTH 7 |
| 512 | 001X | SYMBOL "9", CODE LENGTH 7 |
| 513 | 000X | SYMBOL "5", CODE LENGTH 4 |
| 514 | 1001 | SUBTABLE 313 |
| 515 | 1000 | SUBTABLE 312 |
| 516 | 0110 | SUBTABLE 321 |

HUFFMAN DECODING USING CASCADED SUB-TABLE LOOKUP METHOD

FIELD OF THE INVENTION

The present invention relates generally to a method and apparatus for decoding data, and more particularly to a data decoding method and apparatus for a bitstream encoded by an entropy-based scheme called Huffman coding.

BACKGROUND OF THE INVENTION

Demand for bandwidth among the telecommunications and computer industries has largely outpaced the gains afforded by optical fiber, cable modems and digital subscriber lines. Consequently, data compression and source coding has become ubiquitous. Such applications require faster processors and increased memory to implement the data compression codec. A technique known as "full table lookup" is one of two mutually exclusive methodologies commonly relied on to decode data. Full table lookup involves storing, directly associating and recalling a symbol. Exemplary symbols include an ASCII character, byte, or numeral operable to initiate a given processing function. The symbol is stored in a memory device, or storage table, which includes a ROM (Read Only Memory) or RAM (Random Access Memory). The symbol is logically linked within the table to a unique sequence of bits that comprises a codeword. When such a sequence is conveyed in a bitstream to a storage table, the table 'looks up' and outputs the symbol value associated with the codeword.

The full table lookup method requires minimal processing time and power to associate a complete codeword. However, the memory requirements of the hardware needed for the lookup method's execution limits its utility. For example, if the longest codeword in a bitstream is 16 bits, then pure full table look-up decoding requires a table that contains up to $2^{16}$, 64 K elements. A table of such magnitude can severely burden the memory allocations of a computer system, diminishing its ability to retain other data and programs.

Figure 1:
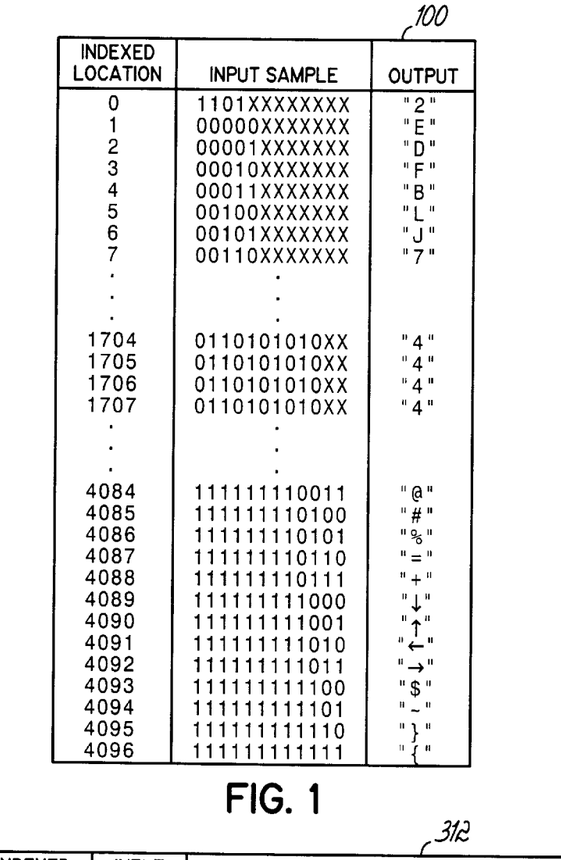
FIG. 1 is a diagram showing the details of an arrangement of a conventional decoding table.

FIG. 1 shows a portion of a storage table suitable for use in a full table lookup application. Turning to the figure, when the codeword "0110101010" is presented in a bitstream, it must be extended to 12 bits by reading two extra bits from the bitstream. So the index "011010101000" to "011010101011" all correspond to the same symbol. The table 100 associates the bit sequence with indexed locations from 1704 to 1707 of the left-hand column and outputs "4." Similarly, the code word "111111110111" is matched at table indexed location 4,088 to the symbol "+." Of note, an "x" in the input sample column represents a logical value of either "1" or "0", i.e., does not matter. Significantly, all 4,096 locations of the table must potentially be recalled in order to match either codeword. Despite relative decreases in the cost of computer memory, disk real estate, and interprocessor bandwidth, the requirements of many such applications make full table lookup techniques impractical and cost ineffective.

Huffman coding is applicable to various items of data, not limited to vector data, images, numerals and ASCII characters. The method capitalizes on similarities between strings of bits and statistical coding. Statistical coding translates the probability of each symbol to a sequence of bits. Namely, the Huffman algorithm takes a string of bits and translates it reversibly into another string that is on the average of shorter length. Generally, the goal of Huffman coding is to use shorter bit patterns for more commonly occurring symbols.

Figure 2:
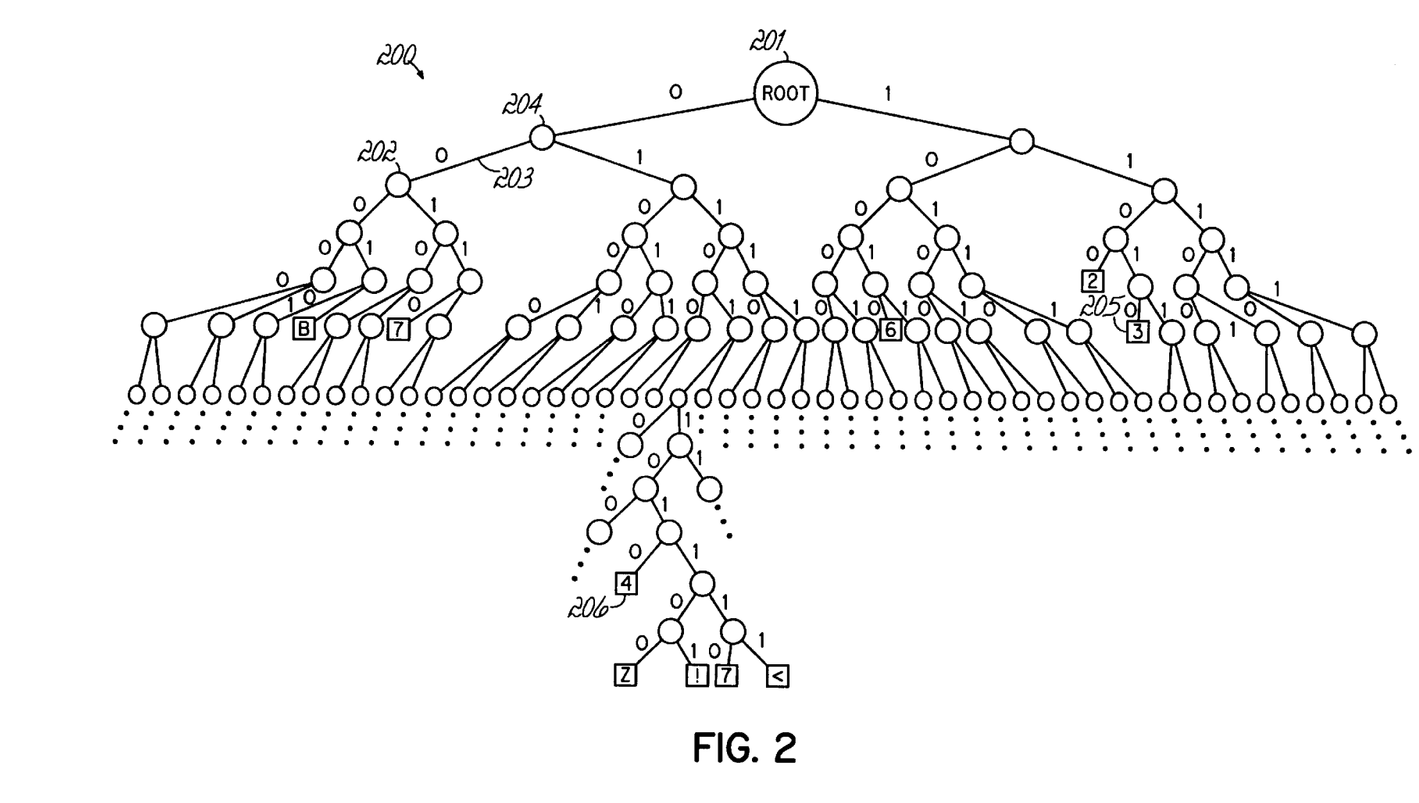
FIG. 2 is an exemplary diagram that illustrates a Huffman code tree for a portion of the application treated in FIG. 1.

Before going into a detailed description of Huffman coding, a code tree appropriate for generating Huffman codes is explained. FIG. 2 illustrates one example of a partial code tree 200 that corresponds to the full table lookup application treated in FIG. 1. Nodes of the tree 200 are points designated by either a circle or a square. A line segment connecting the nodes is called a "branch." The node located in the highest position is called a "root" 201. Further, an under node 202 connected via a branch 203 to a certain node 204 is termed a "child" of the node 204. Conversely, the upper layer node 204 is referred to as a "parent" of the child node 202. A node having no child is called a "leaf," and a unique symbol corresponds to each leaf Further, the nodes excluding the leaves are referred to as "internal nodes," and the number of branches from the root down to each node constitute levels or layers. In the figure, all internal nodes are shown as circles and leaf nodes are displayed as squares.

When encoding by use of the code tree 200, a path extending from the root 201 down to a target leaf is outputted as a code. More specifically, "0" is outputted when branching off to the left from each of the nodes, while "1" is outputted when branching off to the right. For instance, in the code tree illustrated in FIG. 2, the code "11010" leads to a symbol value "3" that corresponds to a leaf node 205. For exemplary purposes, each layer corresponds to N cycles of the computer processor unit (CPU). Thus, 5N processing cycles are required to produce a complete five bit codeword. Likewise, "0110101010" of the above full-table example, uses 10N processing cycles to produce the codeword before it is associates it with the symbol "4" at leaf node 206.

According to Huffman coding, the above-described code tree is generated by the following procedures that comprise the Huffman algorithm: first, leaf nodes are prepared and the frequency of occurrence of their associated symbols are calculated. Second, an internal node is created for the two leaf nodes having the minimum occurrence frequency, and this internal node is connected via branches to the two leaf nodes. Further, a sum of the occurrence frequencies of the two nodes connected via the branch is recorded as an occurrence frequency of the newly created node. Third, the process set forth in the second step is repeated for the remaining nodes, i.e. the nodes not having parents, until the number of remaining nodes is one. In the code tree generated by such procedures, it follows that a code is allocated to each symbol with a code length that is inversely proportional to the occurrence frequency of the symbol. Therefore, when the coding is performed by use of the code tree, it follows that the data can be compressed and less memory space is required.

While decoding, Huffman codewords can be achieved with minimal memory allocation, the processing times required to achieve the enumerated process limits its utility. These limitations are especially applicable to systems possessing small processing reservoirs. Some Huffman circuits have been modified so as to decrease required processing times. For example, one such technique processes two decoded symbols at once. However, no known technique mitigates the substantial processing power requirements of a pure Huffman application.

Currently, program designers must choose between the two mutually exclusive approaches enumerated above. Full table lookup, while resulting in quick processing times, requires tremendous memory capacity. In contrast, tree tracing-based systems demand little storage capacity, but are burdened with multiple CPU cycles. Consequently, what is needed is a decoding technique that does not deplete the memory capacity of the computer or result in excessive processing times, yet still provides coding of data in an efficient, cost effective manner.

SUMMARY OF THE INVENTION

The present invention addresses these and other problems associated with the prior art by providing a unique method and apparatus for decoding a codeword that is embedded in a bitstream. The present invention obtains and uses a first set of bits as an index to a plurality of cascading subtables. A first subtable obtains either a symbol or an address for a second subtable from an indexed location identified by the first bit set. For the latter case, a second set of bits is then obtained and used by the designated second subtable to obtain a symbol and associated code length. Alternatively, the address of a third subtable. The code length is used to determine the lead bit of a second codeword.

One embodiment of the present invention employs Huffman tree-tracing decoding techniques in conjunction with a data table look-up method to maximize the capabilities and efficiencies of available equipment. Generally, the embodiment enables flexible decoding of data by accounting for the processing power and memory limitations of available compression hardware when presetting the size of the bit sample. By adjusting the sampling size, the invention requires smaller memory allocations than methods that instantaneously recall entire codewords. Further, the invention invokes fewer layers of a Huffman tree, translating into smaller processing requirements.

The above and other objects and advantages of the present invention shall be made apparent from the accompanying drawings and the description thereof.

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 3:
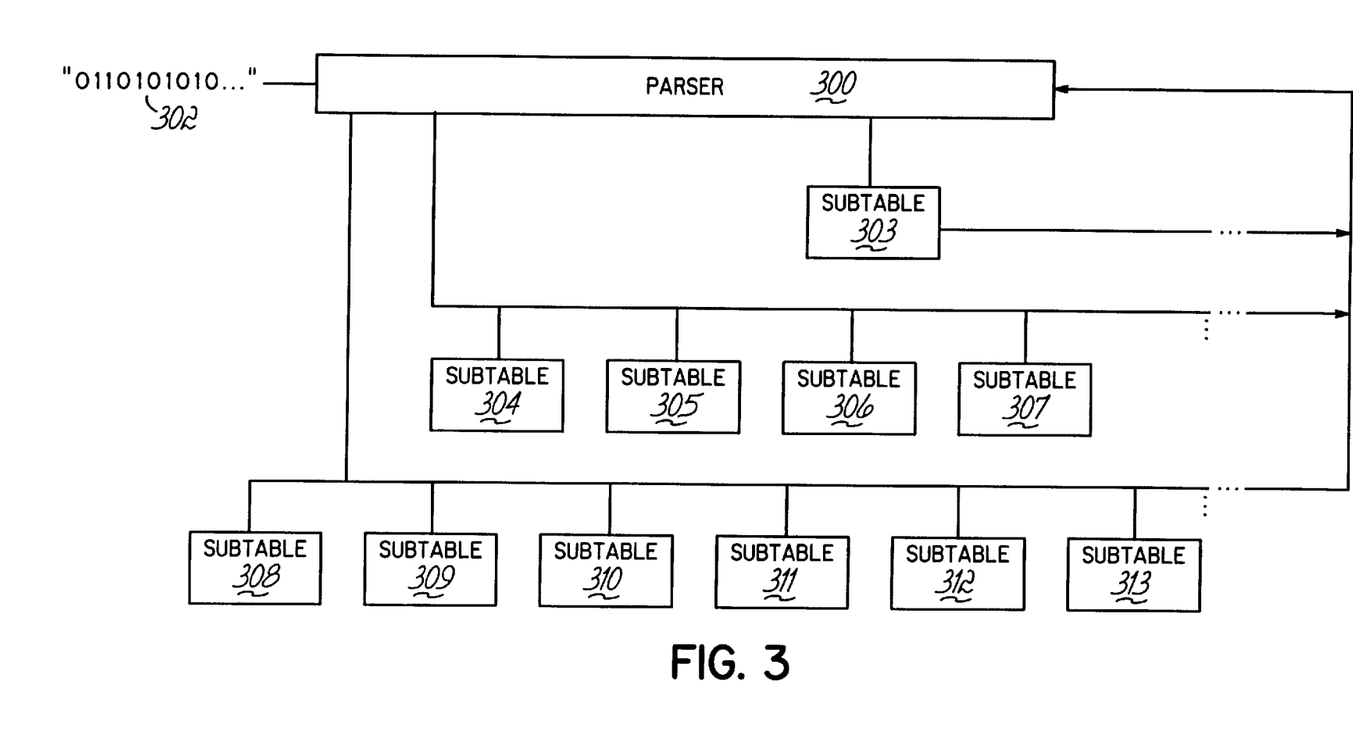
FIG. 3 is a block diagram showing an arrangement of a Huffman circuit for decoding the codeword of FIG. 2 in accordance with the principles of this invention.

FIG. 3 illustrates a Huffman decoding circuit in accordance with the principles of the present invention. The circuit includes a parser 300 used to sample a preset number of consecutive bits from a bitstream 302 to a first layer subtable 303. Using table lookup principles, the first layer subtable 303 uses the bit sample 302 as an index to associate the address of a subtable 305 arranged on a lower processing layer. Blocks 304–313 depict a series of subtables cascading down from the first layer subtable 303.

The subtables are said to be cascading because the output of the each subtable is driven by the output of an upper layer one. The lower-layer subtable 305 is used to further decode the codeword comprised by the sampled bits. Namely, the second-layer subtable 305 uses a memory device such as a ROM (Read Only Memory) to store preprogrammed symbols, code lengths or additional addresses that are output in response to the next bit sample transferred from the parser 300.

Figure 4:
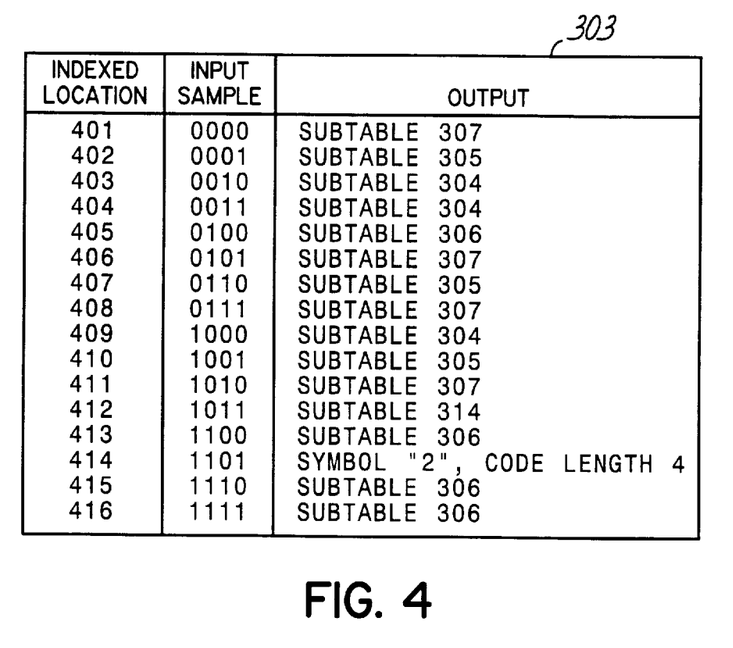
FIG. 4 is a diagram showing the details of an arrangement of the first layer subtable of FIG. 3 in accordance with the principles of the present invention.

More specifically, FIG. 3 illustrates a cascading subtable arrangement for decoding Huffman codes embedded in a feeder bitstream 302. Herein, the maximum code length of a Huffman code conveyed in the bitstream 302 is assumed to be twelve bits. A Huffman codeword "01010110101001 . . . " arrives in series with the bitstream 302 at the parser 300. The exemplary first layer subtable 303 contains 16 indexed locations 401–416, as shown in FIG. 4. The size of the subtable 303 is suited for a sampling size of four bits, in that it can accommodate every combination for the first four bits of each codeword in the application.

A larger or smaller sampling size may be selected depending on the availability of memory processing power and the size of the first layer subtable 303 is adjusted accordingly. For example, where more processing power and less storage space is available, a sampling size of two may be selected. Conversely, eight bits may provide an optimum balance of system allocations in situations where more memory is available. Also, depending on the design of the Huffman decoding application, less than sixteen first layer indexed locations may be actually be required, even for a four bit sample size. For instance, the coding scheme of a particular application may exclude any codewords beginning with the sequence "111." As such, two locations of storage space could be filled with additional information or redundant data.

Referring concurrently to FIGS. 3 and 4, the first four consecutive bits of the bitstream 302 are registered by the parser 300 and are communicated to the first layer subtable 303. The subtable 303 associates the sampled bit sequence with a matching subtable output value. Specifically, the first four bits of the bitstream 302, "0110," constitute a pointer address used by the subtable 303 to retrieve the corresponding index location 407. Since the codeword is longer than the four bit sampling sequence associated at the first layer subtable 303, the decoded portion of the codeword is incomplete, and in Huffman terminology, represents a internal node. Consequently, the indexed location 407 corresponds to an address of a second layer subtable 305 that will further decode the codeword.

The output column of FIG. 4 delineates the output for each indexed location. Of note, location 414 corresponds to a leaf node and will output the symbol "2" in response to the bit sequence "1101." Continuing with the above example, indexed location 407 designates subtable 305 of the second layer of subtables. This address is output to the parser 300, which directs the next four bits of the bitstream 302 to the second layer subtable 305 for evaluation.

Figure 5:
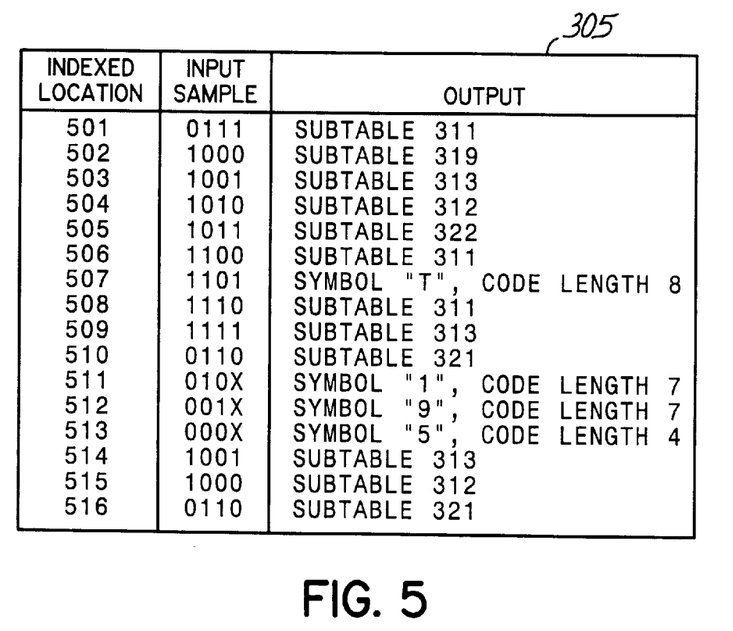
FIG. 5 is a diagram illustrating the details of an arrangement of a second layer subtable of FIG. 3 that is consistent with one embodiment of the present invention.

As with the first layer subtable 303, sixteen indexed locations are stored in the second layer subtable 305 shown in FIG. 5. An "x" in the input column of location 511–513 represents a logical value of either "0" or "1," i.e., does not matter. Of note, some of the output values of the second layer subtable 305 indicate the address of another subtable, while others relate symbols and corresponding code lengths. The significance of this distinction will be addressed below.

The next four bits, "1010," transmitted by the parser 300 are matched to indexed location 504 of the second layer subtable 305. Since the subtable 305 only accounts for the eighth bit of the ten bit codeword 302, element 504 necessarily corresponds to a internal node. Consequently, the address of another subtable is output. Subtable 312 of the third layer is designated by the subtable 305, and its address is forwarded to the parser 300.

Figure 6:
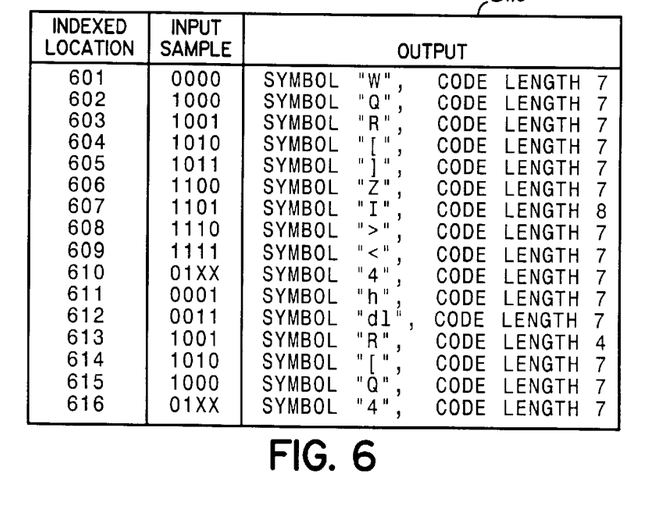
FIG. 6 is a diagram showing the details of an arrangement of a third layer subtable of FIG. 3 in accordance with the principles of the present invention.

The exemplary third layer subtable 312, as shown functionally in FIG. 6, contains another indices of locations 601–616, all of which correspond to leaf nodes. As with the second layer subtable 305, the output value of the leaf locations 601–616 include a symbol and a code length associated with a Huffman codeword. Looking at FIG. 6, the Huffman code portion corresponding to the decoded symbol "<" is set to be "1111," and that for a decoded symbol "Q" is set to be "1000." The code length communicated back to the parser 300 for both symbols is 12 bits, reflecting the entire length of the codewords.

In the ongoing example, when the next four bits of the bitstream "0110" are transmitted to the third layer subtable 312 the leading two bits of the sample are matched at an indexed location 611. The decoded symbol "4" and code length "10" are output accordingly. The code length of 10 bits includes all three sampled portions of the bitstream 02, i.e., the combined input samples of the first, second and third layer subtables 303, 305, 312. Of note, further memory capacity may be preserved by storing both the symbol and codeword length of a table element in the span of one 24 bit word. For instance, the output for indexed location 611 may be designed to store the symbol "4" with 16 bits and the code length 10 with eight bits.

The code length is output back to the parser 300 of FIG. 3, which accounts for the code length when it samples the next four bits to the first layer subtable 303. This step is critical, because the parser 300 has no means to otherwise gauge the length of a codeword when presented in the bitstream 302. This is in part because the code lengths of different symbols vary dramatically, i.e., from one bit to twelve. Because the parser 300 is predisposed to sample every four bits of data, and because not every codeword is a multiple of four, a given sample can include a bit belonging to one or more different codewords. Since such superfluous bits represent the first bits of the next occurring codeword, they must be identified and included in the next bit sample.

In the present example, the bit sample sent to subtable 312 includes "0110," of which only the first two bits are part of the ten bit codeword. Thus, the "1" and "0" trailing bits of the sample are actually the lead bits of the next codeword. The parser 300 uses the reported code length of the first symbol to count into the bitstream the number of bits that corresponds to the length of the first codeword. Specifically, the parser 300 ignores the first 10 bits before sampling the next 4 bits from the bitstream 302. Thus, the eleventh bit, which includes the unused "10" bits of the previous decoding application, is obtained and leads the next bit sample. Those four bits, "1001," are then input into the first layer subtable 303 for evaluation, and the decoding sequence is repeated. Of significance, the 10 bit codeword is decoded using only 3N CPU cycles, rather than the 10N processing cycles required by the pure Huffman application of FIG. 2.

Further, the present invention employs substantially fewer than the thousands of table elements of storage than are required for the same application using the full table lookup technique of FIG. 1.

Figure 7:
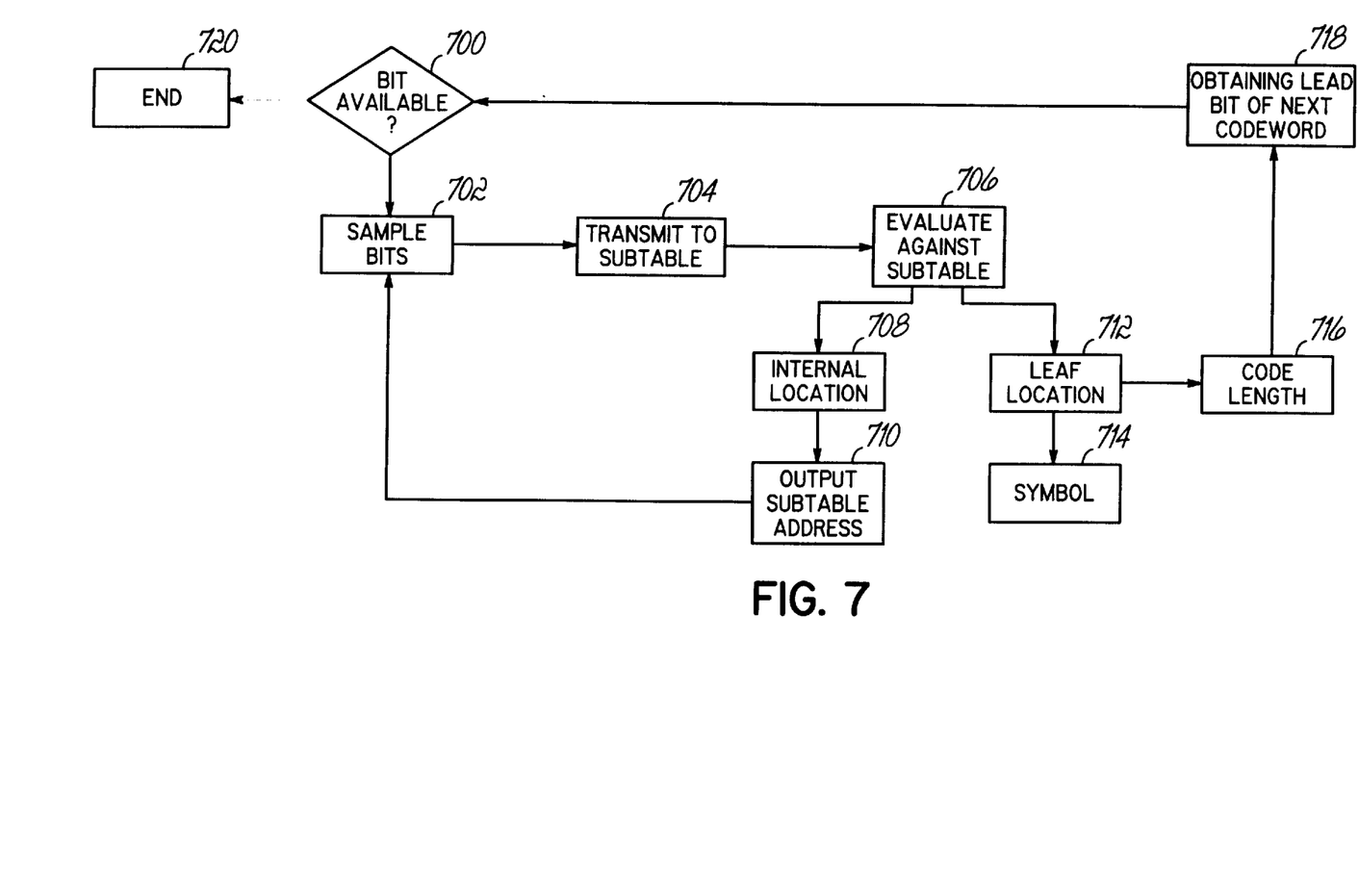
FIG. 7 is a flowchart outlining a decoding process that is consistent with one embodiment of the present invention.

Turning the flowchart of FIG. 7, a binary bitstream is received by the parser at block 700. A bitstream is a series of binary values that embody a series of codewords. Codewords correspond to symbols and may be comprised of varying bit lengths. Common symbols include ASCII characters, bytes or numbers. Prior to encoding, the symbols used in an application are paired with codewords by a user according to a Huffman coding tree or comparable lossless compression algorithm. Under Huffman principles, the shortest-length codewords are associated with the most frequently employed symbols. Thus on the average, the length of accessed codewords will be shorter than their corresponding symbols.

At block 702, a predetermined number of n bits are sampled from the bitstream. Prior to decoding, the sampling size of the parser, i.e., the number of binary bits obtained by the parser, is predetermined by a user according to the memory capacity and processing power limitations of the applied hardware. Other considerations pertinent to the sampling size relate to the design of the Huffman coding scheme. At block 704, the sampled bits from the bitstream are transmitted to a first layer subtable.

The size or number of elements of the first layer subtable is determined as a function of the sampling size of the unit. More specifically, the subtable is made just big enough to account for every decimal value of an n-bit binary sample. Mathematically, the number of indexed locations can be calculated using $2^n$. For instance, the subtable of the four bit sample application of FIG. 4 contains 16 elements. Of note, there is no advantage to arranging and numbering the elements sequentially, as shown in the figure. Also, the size of the depicted subtable assumes that all possible binary sample combinations are needed in the application. A smaller, or compacted subtable can alternatively be employed were an encoding scheme does not exhaust all binary combinations.

At block 706, the first layer subtable associates the input sample sequence with a corresponding indexed location. Namely, the sample acts as a pointer address and is matched to a bit sequence stored by the subtable. If the input sequence prompts the subtable to output the address of a another subtable, then that element corresponds to an internal node 708. At block 710, internal node locations output the address of the next subtable required to decode the remaining portion of the codeword. Analogous to a Huffman decoding tree scheme, the designated subtable will be located on the next occurring layer of subtables. In this manner, the subtables are said to be cascading, meaning that the output of one subtable drives the output of the next applied subtable. The address of the lower layer subtable is ultimately communicated back to the parser at block 702.

At blocks 702 and 704, the parser buffers the next sequence of n bits from the bitstream. The sampled bit sequence begins with the first bit of the stream that was not previously transmitted to the first layer subtable, and ends with the last bit in accordance with the preset sampling length of n. This second bit sample is then evaluated against the lower layer subtable designated by the first layer subtable at block 706. As before, the binary bit sequence of the second sample is matched to the contents of the second layer subtable.

If the associated indexed location again corresponds to an internal node 708, then the address of an appropriate, third-layer subtable is output to the parser at block 710. The procedure will repeat as needed until a bit sample corresponding to a leaf node 712 is encountered at a lower layer subtable. Such a bit sample will include the last bit of a given codeword.

Whether an indexed location corresponds to a leaf node is determined at block 706. If the indexed location associated with the bit sample includes a symbol value, then the location contains leaf data. An indexed location is operable to output a decoded symbol 714 and the number of bits required to code the symbol 716. Because the parser does not know the length of the codeword it is currently applying, it is relegated to consistently sample the bitstream at the preset sampling size. Consequently, the last sample used to decode any codeword for which the sampling size in not a factorial of n will contain at least one bit that is actually part of the next codeword. Thus, it is critical that the codeword length of a symbol be reported back to the unit.

At block 718, the parser counts into the bitstream the number of bits equaling the code length. The parser then samples the next n bits at block 700 beginning with the first bit of the next codeword. By accounting for the codeword length the invention insures that unused sampled bits lead the next bit sample. When the end of a transmitted bitstream is reached, that is, when all of the bits have been associated with a leaf node at block 706, then the decoding process is complete at 720.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method for decoding a codeword embedded in a bitstream, comprising:
   obtaining a first set of bits from a bitstream;
   using said first set of bits as an index to a first subtable;
   obtaining from an indexed location in said first subtable identified by said first set of bits, an address for a second subtable, wherein the second subtable includes a symbol;
   obtaining a second set of bits from said bitstream;
   using said second set of bits as an index to said second subtable; and
   outputting said symbol from said second subtable in response to said index consisting of said second set of bits.

2. The method for decoding a codeword embedded in a bitstream of claim 1, further comprising obtaining from an indexed location in said second subtable a symbol, associated code length, or third subtable address.

3. The method for decoding a codeword embedded in a bitstream of claim 2, where in s aid code length represents a number of bits comprising a codeword.

4. The method for decoding a codeword embedded in a bitstream of claim 2, further comprising determining a lead bit for a third set of bits based upon the code length.

5. The method for decoding a codeword embedded in a bitstream of claim 2, further comprising using the code length in sampling a further set of bits.

6. The method for decoding a codeword embedded in a bitstream of claim 2, further comprising counting into the bitstream from a first bit of the codeword a number of bits corresponding to the codeword length to determine a lead bit of a second codeword.

7. The method for decoding a codeword embedded in a bitstream of claim 2, wherein the symbol comprises one or more of vector data, images, numerals and ASCII characters.

8. The method for decoding a codeword embedded in a bitstream of claim 1, wherein indices of locations of the first subtable encompass all binary combinations for a first n bits of all codewords.

9. The method for decoding a codeword embedded in a bitstream of claim 8, wherein the value of n is less than the number of bits in a longest codeword used in said bitstream.

10. The method for decoding a codeword embedded in a bitstream of claim 8, wherein said subtables contain $2^n$ subtable locations.

11. The method for decoding a codeword embedded in a bitstream of claim 1, wherein said bitstream comprises a plurality of codewords and the codewords are of variable length.

12. A method for decoding a codeword embedded in a bitstream, comprising:
    obtaining a first set of bits from a bitstream;
    using said first set of bits as an index to a first subtable;
    obtaining from an indexed location in said first subtable identified by said first set of bits, an address for a second subtable of a second layer comprising a plurality of subtables, wherein at least one of the plurality of subtables is smaller than another'subtable of said plurality of subtables;
    obtaining a second set of bits from said bitstream; and
    using said second set of bits as an index to said second subtable.

13. An apparatus for decoding a codeword embedded in a bitstream, comprising:
    a parser obtaining a first and a second set of bits from a bitstream comprised of at least one codeword;
    storage containing a first subtable and a second subtable; and
    a computational device operable to obtain from an indexed location in said first subtable identified by said first set of bits, the address of a second subtable, wherein the second subtable includes a symbol;
    and further operable to obtain said symbol from an indexed location in said second subtable identified by said second set of bits.

14. The apparatus for decoding a codeword embedded in a bitstream according to claim 13, wherein said symbol obtained from said second subtable includes one or more of ASCII characters, numerals, vector data and images.

15. The apparatus foe deciding a codeword embedded in a bitstream according to claim 13, wherein the parser is further operable to determine a lead bit of a third set of bits based on a code length transmitted from the second subtable.

16. The apparatus for decoding a codeword embedded in a bitstream according to claim 13, wherein the parser counts into the bitstream from a lead bit of a first codeword a number of bits corresponding to the code length to determine a lead bit of a second codeword.

17. The apparatus for decoding a codeword embedded in a bitstream according to claim 13, wherein the bitstream comprises a plurality of codewords and the codewords are of variable length.

18. An apparatus for decoding a codeword embedded in a bitstream according to claim 13, wherein indices of locations of the first layer subtable encompass all binary combinations for a first n bits of all codewords in a bitstream.

19. An apparatus for decoding a codeword embedded in a bitstream according to claim 18, wherein the value of n is less than the number of bits in a longest codeword in the bitstream.

20. An apparatus for decoding a codeword embedded in a bitstream according to claim 18, wherein said subtables contain $2^n$ indices of locations.

21. An apparatus for decoding a codeword embedded in a bitstream according to claim 13, wherein the bitstream comprises a plurality of codewords and the codewords are of variable length.

22. A method for decoding a codeword embedded in a bitstream comprising:

sampling a number of bits corresponding to a sampling size from the bitstream;

determining a memory capacity associated with a subtable of a plurality of subtables;

adjusting said sampling size of bits sampled from the bitstream according to said determined memory capacity; and sampling an adjusted number of bits corresponding to said adjusted sampling size.

* * * * *

UNITED STATES PATENT AND TRADEMARK OFFICE
CERTIFICATE OF CORRECTION

PATENT NO. : 6,580,377 B1
DATED : June 17, 2003
INVENTOR(S) : Du et al.

It is certified that error appears in the above-identified patent and that said Letters Patent is hereby corrected as shown below:

Column 2,
Line 13, reads "each leaf Further" and should read -- each leaf. Further --.

Column 7,
Line 60, reads "where in s aid code" and should read -- wherein said code --.

Column 8,
Line 30, reads "another' subtable" and should read -- another subtable --.

Signed and Sealed this

Fourth Day of November, 2003

JAMES E. ROGAN
*Director of the United States Patent and Trademark Office*